(12) United States Patent
Kameda et al.

(10) Patent No.: US 11,168,790 B2
(45) Date of Patent: Nov. 9, 2021

(54) SLIDING MEMBER AND PISTON RING

(71) Applicant: KABUSHIKI KAISHA RIKEN, Tokyo (JP)

(72) Inventors: Kazuya Kameda, Tokyo (JP); Yuuichi Ishida, Tokyo (JP); Hiroshi Maruyama, Tokyo (JP); Takuma Sekiya, Tokyo (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 0 days.

(21) Appl. No.: 16/499,927

(22) PCT Filed: Oct. 9, 2018

(86) PCT No.: PCT/JP2018/037593
§ 371 (c)(1),
(2) Date: Oct. 1, 2019

(87) PCT Pub. No.: WO2019/078052
PCT Pub. Date: Apr. 25, 2019

(65) Prior Publication Data
US 2020/0284346 A1    Sep. 10, 2020

(30) Foreign Application Priority Data

Oct. 20, 2017  (JP) .............................. JP2017-203898

(51) Int. Cl.
*F16J 9/26*        (2006.01)
*C23C 14/06*       (2006.01)
(Continued)

(52) U.S. Cl.
CPC ............ *F16J 9/26* (2013.01); *C23C 14/0605* (2013.01); *C23C 14/325* (2013.01); *C23C 28/044* (2013.01)

(58) Field of Classification Search
CPC ..... F16J 9/26; C23C 14/0605; C23C 14/0611; C23C 14/325; C23C 28/044
See application file for complete search history.

(56) References Cited

U.S. PATENT DOCUMENTS 9,222,166 B2 * 12/2015 Sugimoto ............... C23C 14/35
9,371,797 B2 *  6/2016 Sekiya .................. C23C 28/046
(Continued)

FOREIGN PATENT DOCUMENTS

CN       102080207       *  6/2011
CN       102080207 A        6/2011
(Continued)

OTHER PUBLICATIONS

May 21, 2019, Decision to Grant a Patent issued by the Japan Patent Office in the corresponding Japanese Patent Application No. 2017-203898.
(Continued)

*Primary Examiner* — Nicholas L Foster
(74) *Attorney, Agent, or Firm* — Kenja IP Law PC

(57) ABSTRACT

A sliding member having a hard carbon coating that has a thickness of 3 μm or more and demonstrates high peeling resistance and high wear resistance is provided. A sliding member 100 according to the present disclosure includes a base member 10 and a hard carbon coating 12 that is formed on the base member 10 and has the hydrogen content of 3 atomic % or less and a thickness of 3 μm or more. When HM represents a Martens hardness of the hard carbon coating 12 and HIT represents an indentation hardness, the ratio HM/HIT is 0.40 or more.

9 Claims, 2 Drawing Sheets

(51) Int. Cl.
*C23C 14/32* (2006.01)
*C23C 28/04* (2006.01)

(56) References Cited

U.S. PATENT DOCUMENTS

| | | | | |
|---|---|---|---|---|
| 9,488,275 B2* | 11/2016 | Ivanov | | C23C 28/32 |
| 9,644,738 B2* | 5/2017 | Kunimoto | | C23C 16/26 |
| 9,759,322 B2* | 9/2017 | Araujo | | F16J 9/26 |
| 10,036,345 B2* | 7/2018 | Tsuji | | F16J 9/26 |
| 10,100,929 B2* | 10/2018 | Honda | | C23C 14/024 |
| 10,578,214 B2* | 3/2020 | Ozaki | | F02F 5/00 |
| 10,619,739 B2* | 4/2020 | Ozaki | | F16J 9/26 |
| 10,655,208 B2* | 5/2020 | Shinohara | | F16C 33/10 |
| 10,670,147 B2* | 6/2020 | Kameda | | F16C 33/12 |
| 2007/0224349 A1* | 9/2007 | Hosenfeldt | | C23C 14/0605 427/249.1 |
| 2012/0103182 A1* | 5/2012 | Sugimoto | | F04B 53/14 92/165 R |
| 2013/0036942 A1* | 2/2013 | Ramm | | H01J 37/34 106/287.17 |
| 2013/0140776 A1 | 6/2013 | Kennedy | | |
| 2014/0137733 A1* | 5/2014 | Sekiya | | C23C 14/325 92/172 |
| 2015/0011444 A1* | 1/2015 | Ramm | | C10M 103/06 508/100 |
| 2015/0018254 A1* | 1/2015 | Araujo | | C23C 28/341 508/105 |
| 2015/0136062 A1* | 5/2015 | Tsuji | | F16J 9/00 123/193.4 |
| 2015/0300493 A1* | 10/2015 | Kunimoto | | F16J 9/26 123/193.2 |
| 2015/0362071 A1* | 12/2015 | Ivanov | | C23C 28/32 277/442 |
| 2016/0003356 A1 | 1/2016 | Ozaki et al. | | |
| 2016/0230697 A1* | 8/2016 | Shinohara | | C23C 4/06 |
| 2016/0245407 A1* | 8/2016 | Honda | | F16J 10/04 |
| 2018/0180181 A1* | 6/2018 | Ozaki | | F02F 5/00 |
| 2018/0180182 A1* | 6/2018 | Ozaki | | C23C 28/44 |
| 2018/0245200 A1* | 8/2018 | Shinohara | | C23C 28/343 |
| 2020/0056700 A1* | 2/2020 | Kameda | | C23C 14/06 |

FOREIGN PATENT DOCUMENTS

| | | | | |
|---|---|---|---|---|
| CN | 105555989 | * | 5/2016 | |
| CN | 105555989 A | | 5/2016 | |
| EP | 1510594 A2 | | 3/2005 | |
| EP | 3196332 A1 | | 7/2017 | |
| JP | 2006250348 A | | 9/2006 | |
| JP | 2008081522 A | | 4/2008 | |
| JP | 2017101279 A | | 6/2017 | |
| WO | WO-2017022660 A1 | * | 2/2017 | C23C 14/54 |

OTHER PUBLICATIONS

Nov. 6, 2018, International Search Report issued in the International Patent Application No. PCT/JP2018/037593.

Apr. 21, 2020, International Preliminary Report on Patentability issued in the International Patent Application No. PCT/JP2018/037593.

Mar. 4, 2020, Decision of Objection issued by the Japan Patent Office in the corresponding Japanese Patent No. 6533818.

Aug. 28, 2020, Office Action issued by the China National Intellectual Property Administration in the corresponding Chinese Patent Application No. 201880058600.X.

Apr. 6, 2021, the Extended European Search Report issued by the European Patent Office in the corresponding European Patent Application No. 18867341.2.

Jan. 21, 2021, Office Action issued by the China National Intellectual Property Administration in the corresponding Chinese Patent Application No. 201880058600.X.

May 14, 2021, Office Action issued by the China National Intellectual Property Administration in the corresponding Chinese Patent Application No. 201880058600.X.

* cited by examiner

SLIDING MEMBER AND PISTON RING

TECHNICAL FIELD

The present disclosure relates to a sliding member having a hard carbon coating that combines high peeling resistance and high wear resistance, and also to a piston ring formed by the sliding member.

BACKGROUND

In a sliding member such as a piston ring, a base member is typically treated with a hard carbon coating such as a diamond-like carbon (DLC: Diamond Like Carbon) coating so as to increase hardness and wear resistance.

PTL 1 set forth below describes a sliding member that includes a base member, an intermediate layer that is formed on the base member, and a DLC coating that is formed on the intermediate layer with a thickness of 0.5 μm to 5 μm and a hydrogen content of 5 atomic % or less, and preferably 2 atomic % or less, for the purpose of providing a sliding member having a DLC coating that demonstrates high hardness and high wear resistance. According to PTL 1, it is preferable to set the indentation hardness of the coating to 20 to 70 GPa and the Young's modulus of the coating to 60 GPa or more in order to suppress chipping and peeling of the coating.

PTL 2 set forth below describes a sliding member that includes a base member, an intermediate layer formed on the base member, and a DLC coating formed on the intermediate layer with a thickness of 0.15 μm to 6.0 μm, for the purpose of providing a sliding member having a DLC coating that demonstrates high wear resistance. PTL 2 describes that the coating is prone to cracking and peeling when the Young's modulus of the coating is more than 180 GPa, and load bearing of the coating deteriorates during sliding when the Young's modulus of the coating is less than 50 GPa. PTL2 also describes that the surface hardness of the coating is preferably 20 to 140 GPa.

CITATION LIST

Patent Literature

PTL 1: JP 2006-250348 A
PTL 2: JP 2008-81522 A

SUMMARY

Technical Problem

In PTL 1 and PTL 2 the Young's modulus is adjusted with consideration to distortion due to application of a stress and the indentation hardness is adjusted with consideration to plastic deformation, within the predetermined ranges so as to obtain a DLC coating that has high hardness and high wear resistance. However, in recent years there is a tendency to increase the coating thickness from the viewpoint of durability, and therefore focusing on the Young's modulus and the indentation hardness alone, there is room for improvement in realizing both high peeling resistance and high wear resistance for cases in which the coating thickness is 3 μm or more.

In view of the above problem, the present disclosure provides a sliding member having a hard carbon coating with a thickness of 3 μm or more and combining high peel resistance and high wear resistance. The present disclosure also provides a piston ring formed by the sliding member.

Solution to Problem

In order to solve the above problem, the inventors conducted experiments to form a hard carbon coating having a thickness of 3 μm or more on a base member by performing ion plating that effectively regulates the hydrogen content of the coating to 3 atomic % or less. As a result, it was found that the higher the density is, the higher the peeling resistance and wear resistance of the coating become. Based on this experimental result, it was conceived that it is important to focus on the Martens hardness with consideration of elastic deformation correlated with the density in order to improve the wear resistance of the coating. As a result of further studies, it was found that a coating having excellent peeling resistance and wear resistance can be obtained by setting the ratio (HM/HIT) of the Martens hardness (HM) to the indentation hardness (HIT) to 0.40 or more.

The present invention was completed based on the above findings, and the summary and configuration of the present invention are as follows:

(1) A sliding member including a base member and a hard carbon coating that is formed on the base member and has a hydrogen content of 3 atomic % or less and a thickness of 3 μm or more;

wherein, where HM represents a Martens hardness of the hard carbon coating and HIT represents an indentation hardness, the ratio HM/HIT is 0.40 or more.

(2) The sliding member of (1), wherein the HIT is 15 GPa or more and 50 GPa or less.

(3) The sliding member of (1) or (2), wherein the thickness of the hard carbon coating is 5 μm or more.

(4) The sliding member of any one of (1) to (3), wherein a surface roughness Ra of the hard carbon coating is 0.12 μm or less.

(5) The sliding member of any one of (1) to (4), further comprising an intermediate layer between the base member and the hard carbon coating, the intermediate layer comprising one or more materials selected from among Cr, Ti, Co, V, Mo, and W, and carbides, nitrides, and carbonitrides thereof.

(6) A piston ring comprising the sliding member of any one of (1) to (5).

Advantageous Effect

The present disclosure can achieve a sliding member having a hard carbon coating with a thickness of 3 μm or more that combines high peeling resistance and high wear resistance. Further, the present disclosure can achieve a piston ring formed by the sliding member.

DETAILED DESCRIPTION

Hereinafter, a sliding member and a piston ring according to an embodiment of the present disclosure will be described with reference to FIG. 1 and FIG. 2.

Sliding Member

Figure 1:
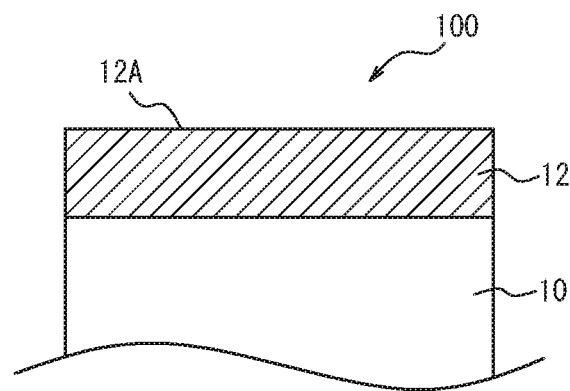
FIG. 1 is a schematic cross-sectional view of a sliding member 100 according to an embodiment of the present disclosure.

As illustrated in FIG. 1, a sliding member 100 according to the present embodiment includes a base member 10 and a hard carbon coating 12 formed on the base member 10.

Base Member

The base member 10 of the present embodiment can be any base member with the strength necessary for a sliding member. Examples of the material for the base member 10 include conductive materials such as iron, cast iron, cemented carbide, stainless steel, and aluminum alloy. Further, the base member 10 may be subjected to hard coating or plating using metal nitride such as chromium or titanium nitride, metal carbon nitride, or metal carbide, or may be subjected to a hardening treatment such as quenching and tempering or nitriding treatment when the material of the base member 10 is iron-based. Conventionally, it is preferable to use a Martensitic stainless steel, a spring steel, or a carbon steel for the piston ring.

Hard Carbon Coating

The hard carbon coating 12 of the present embodiment is a diamond-like carbon (DLC: Diamond-like Carbon) coating 12.

The hydrogen content of the DLC coating 12 is 3 atomic % or less. When the hydrogen content exceeds 3 atomic %, sufficient hardness and wear resistance cannot be obtained. The hydrogen content can be measured using the HFS (Hydrogen Forward Scattering) technique.

The thickness of the DLC coating 12 is 3 µm or more. When the thickness is less than 3 µm, sufficient durability cannot be obtained. The thickness of the DLC coating is more preferably 5 µm or more. Because longer formation coating times are required as the thickness of the DLC coating 12 increases, from the viewpoint of productivity, the thickness of the DLC coating 12 is preferably 30 µm or less. The thickness of the coating may be determined by observing a cross-section of the coating using a SEM (Scanning Electron Microscope).

When HM and HIT respectively represent the Martens hardness and the indentation hardness of the DLC coating 12, the ratio HM/HIT is 0.40 or more. In the present embodiment, in which the DLC coating has a hydrogen content of 3 atomic % or less and a thickness of 3 µm or more, it is important to set the ratio HM/HIT to 0.40 or more. The technical significance of this will be described below.

Based on the above mentioned experimental result that the higher the density of a DLC coating with a hydrogen content of 3 atomic % or less and a thickness of 3 µm or more is, the higher peeling resistance and wear resistance become, the inventors have conceived that it is important to focus on the Martens hardness with consideration to elastic deformation, which is considered to be highly correlated with the density, in order to realize both high peeling resistance and high wear resistance. That is, the indentation hardness (HIT) is an index of hardness (plastic hardness) based on plastic deformation in a manner similar to Vickers hardness and can be considered to be correlated with the tensile strength of the coating itself (coating strength). On the other hand, the Martens hardness (HM) is a hardness based on elastoplastic deformation with consideration to elastic deformation (elastoplastic hardness) and is greatly affected by coating rigidity and compressive residual stress within the coating. Here, the higher the density is, the higher the rigidity and the compressive residual stress tend to become. To obtain a coating with wear resistance, it is of basic importance to increase the plastic hardness. However, when the coating has excessively high plastic hardness, the coating becomes prone to brittleness and wear derived from fine cracks tends to increase. Further, peeling of the coating occurs from cracks generated by elastoplastic deformation of the coating itself. The optimum rigidity range of the coating varies depending on whether the sliding environment corresponds to a system operating with a predetermined stress or a system operating with a predetermined strain. Because typical sliding environments are more often systems operating with a predetermined stress, coatings having high rigidity tend to be able to suppress the generation of cracks and demonstrate excellent peeling resistance. As described above, it was found that it is important to balance the Martens hardness (HM) serving as an indicator of density, which is considered to be strongly correlated with the coating rigidity and the residual stress, and the indentation hardness (HIT) serving as an index of the plastic hardness correlated with the coating strength, in order to realize a sliding member with excellent properties. Note that, although the indentation hardness (HIT) is also somewhat affected by the density that has a strong correlation with rigidity and residual stress of the coating, the influence is not as great as that on the Martens hardness (HM). Thus, as a result of experimental studies as described above, it was found that a coating that combines high peeling resistance and high wear resistance can be obtained by setting the ratio HM/HIT to 0.40 or more. The ratio HM/HIT is preferably 0.40 or more and 0.55 or less.

The HIT is preferably 15 GPa or more and 50 GPa or less. When the HIT is 15 GPa or more, sufficient strength can be obtained. Further, when the HIT is 50 GPa or less, there is no risk that the coating exhibits brittleness, and a coating with excellent wear resistance can be obtained. Furthermore, the HM is preferably 6 GPa or more and 20 GPa or less. When the HM is 6 GPa or more, the density can be increased, and thus a coating with excellent peeling resistance can be obtained. When the HM is 20 GPa or less, there is no risk that the coating is peeled off even if the coating thickness is increased.

The "Indentation Hardness (HIT)" and the "Martens Hardness (HM)" in the present disclosure are based on the nano-indentation hardness testing methods specified in International Standard ISO14577-1:2015. In particular, a (Berkovich) diamond indenter with a tip shaped as a regular three-sided pyramid is pressed into the surface of the coating, and the load applied to the indenter and the displacement of the indenter thus caused are continuously monitored to acquire a "load-displacement curve". Then, according to the calculation methods described in ISO14577-1:2015, the indentation hardness (HIT) and the Martens hardness (HM) are calculated. Note that, the indentation load is set such that the maximum indentation depth of the diamond indenter is $1/10$ or less of the coating thickness in order to avoid influence of the base member under the coating. Further, the sample portion is subjected to mirror polishing as a pretreatment to suppress variation in the test value.

A DLC coating 12 with characteristics as described above can be formed on the base member 10 by, for example, ion plating using vacuum arc discharge employing a carbon target. Hereinafter, the method for forming the DLC coating 12 are described.

In general, ion plating entails depositing ionized carbon on the surface of the base member 10 to which a negative bias voltage is applied by evaporating and ionizing a carbon cathode using vacuum arc discharge in a vacuum atmosphere of $1 \times 10^{-1}$ Pa or less. Accordingly, the DLC coating 12 is formed on the base member 10. Unlike chemical vapor deposition (CVD) methods in which a carbide containing hydrogen such as methane is used as the raw material, the raw material used in ion plating methods does not contain hydrogen, and thus the hydrogen content of the coating can be suppressed to 3 atomic % or less. Note that ion plating methods also include the so-called FCVA (Filtered Cathodic Vacuum Arc) method according to which carbon that is not iodized during evaporation is trapped and removed using a magnetic filter. Here, the value of the ratio HM/HIT does not depend on the presence or absence of the magnetic filter.

In the present embodiment, it is important to set the ratio HM/HIT to 0.40 or more, which can be achieved by adjusting the bias voltage and the arc discharge current within the following ranges. The bias voltage is set to −50 V or more and 0 V or less. When the bias voltage is less than −50 V, an increase of the HM tends to become small with respect to an increase of the HIT, and thus the ratio HM/HIT becomes less than 0.40. Further, the arc discharge current is set to 50 A or more and 200 A or less. Because a dense DLC coating cannot be formed when the arc discharge current is less than 50 A, an increase of the HM becomes small with respect to an increase of the HIT, and thus the ratio HM/HIT becomes less than 0.40. When the temperature rise of the base member is suppressed by setting the arc discharge current to 200 A or less and appropriately pausing discharge, there is no risk of deterioration of the hardness of the DLC coating, and hence it becomes possible to obtain an HIT of 15 GPa or more and an HM of 6 GPa or more. Here, in the range in which the bias voltage is −50 V or more and 0 V or less, and the arc discharge current is 50 A or more and 200 A or less, the ratio HM/HIT is reduced in response to an increase in the absolute value of the bias voltage, and the ratio HM/HIT is increased in response to an increase in the arc discharge current. Note that the temperature of the base member is preferably 100° C. or more and 230° C. or less.

The thickness of the DLC coating 12 can be controlled by the arc discharge duration.

A sliding member of the present disclosure has been described by an exemplary embodiment, but the present disclosure is not limited to the above embodiment. Appropriate changes may be made within the scope of the patent claims.

For example, in order to improve the adhesion of the hard carbon coating to the base member, an intermediate layer formed from one or more materials selected from among Cr, Ti, Co, V, Mo, and W, and carbides, nitrides, and carbonitrides thereof may be provided between the base member and the hard carbon coating. The thickness of the intermediate layer is preferably 0.01 μm or more and 0.6 μm or less, and more preferably 0.02 μm or more and 0.5 μm or less. When the thickness of the intermediate layer is 0.01 μm or more, the adhesion of the hard carbon coating can be improved. When the thickness of the intermediate layer is 0.6 μm or less, the intermediate layer is less likely to cause plastic flow during sliding, and thus suppressing peeling of the hard carbon coating. The intermediate layer can be formed on the base member by appropriate use of an arbitrary or known PVD (physical vapor deposition) method.

Further, from a viewpoint of further reducing a wear amount of a counterpart member during sliding, the DLC coating 12 preferably has a surface roughness Ra of 0.12 μm or less. Such a surface roughness can be realized by treating the surface of the DLC coating with an arbitrary or known lapping process. Note that "surface roughness Ra" in the present disclosure refers to an arithmetic mean roughness Ra as prescribed in JIS B 0601 (2001).

Piston Ring

Figure 2:
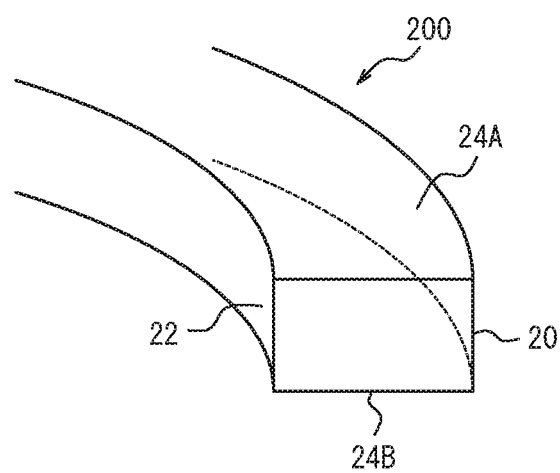
FIG. 2 is a perspective cross-sectional view of a piston ring 200 according to the embodiment of the present disclosure.

As illustrated in FIG. 2, a piston ring 200 according to an embodiment of the present disclosure is formed by the above-described sliding member 100 having an outer peripheral surface 20 formed from a DLC coating surface 12A as described above and illustrated in FIG. 1. The piston ring 200 includes the outer peripheral surface 20 as a sliding surface constituting the surface 12A of the DLC coating that has high peeling resistance and high wear resistance, and thus combines excellent peeling resistance and wear resistance in a high-load sliding environment. Note that the inner circumferential surface 22, the top surface 24A, and the bottom surface 24B of the piston ring 200 do not need to have the structure illustrated in FIG. 1.

In addition to piston rings, the sliding member 100 according to embodiments of the present disclosure is applicable to, for example, a valve lifter and a shim as valve operating components of an internal combustion engine of an automobile, a piston pin as a component of an internal combustion engine, a compressor, or a hydraulic pump vane.

EXAMPLES

In each of examples and comparative examples, piston rings were produced in accordance with the following conditions to form the DLC coating surfaces listed in Table 1 constituting the outer peripheral surface of the piston rings illustrated in FIG. 2.

In each of the examples and comparative examples, an intermediate layer made of chromium having a thickness of 0.4 μm was formed on a base member made of silicon chromium steel with a nominal diameter of 90 mm, a thickness of 2.9 mm, and a width of 1.2 mm by performing a known PVD method. Subsequently, in a vacuum atmosphere of $1 \times 10^{-1}$ Pa or less, the DLC coating listed in Table 1 was formed by performing ion plating using vacuum arc discharge employing a target carbon and appropriately adjusting a bias voltage, an arc discharge current, and an arc discharge duration within the aforementioned respective ranges. DLC deposition was formed by performing carbon sputtering while introducing a hydrocarbon gas, in Comparative Example 4 alone.

(Explanation of Evaluation Method and Evaluation Results)

In each of the examples and comparative examples, the thickness, the surface roughness, the HM, and the HIT of the DLC coating were obtained by the methods described above. An ENT-1100a produced by Elionix Inc. was used as a nano-indentation hardness tester. Also, the ratio HM/HIT was calculated using the test values of the HM and the HIT. In testing of the HM and the HIT, the indentation load was set to 50 mN in Examples 1 to 6 and 8, and Comparative Examples 1 to 4, and to 6 mN in Example 7 and Comparative Example 5, such that the maximum indention depth of the diamond indenter was regulated to 1/10 or less of the coating thickness.

In each of the examples and comparative examples, the hydrogen content of the DLC coating was evaluated by the method described below. The hydrogen content was evaluated by RBS (Rutherford Backscattering Spectrometry)/HFS (Hydrogen Forward Spectrometry) in respect of the DLC coating formed in a flat region or a region having a radius of curvature sufficient to serve as a flat measurement surface. On the other hand, the hydrogen content of the DLC coating formed in regions that were not flat such as the outer peripheral surface of the piston ring was evaluated by a combination of RBS/HF and SIMS (Secondary Ion Mass Spectrometry). Although RBS/HFS is a known analytical method, the RBS/HFS is not applicable to analysis of an uneven surface. Thus, the RBS/HF and SIMS are combined in a manner as described below.

First, a DLC coating was formed as a reference value measurement target on a flat test sample subjected to mirror-polishing (an SKH51 disk having φ25 diameter×5 mm thickness and a hardness HRC of 60 to 63 that is subjected to quenching treatment) prepared as a reference sample having a flat surface. Next, the hydrogen content of the DLC coating was evaluated using the RBS/HFS. On the other hand, the DLC coatings of the examples and the comparative examples were subjected to SIMS analysis to measure the secondary ion intensity of hydrogen. Note that the SIMS analysis can be performed on a coating formed on a non-flat surface such as an outer circumferential surface of a piston ring. Then, for the same coating with that of the reference samples, an empirical formula (a metering line) indicative of a relationship between the hydrogen content (unit:atomic %) acquired by the RBS/HFS and a ratio of the secondary ion intensity of the hydrogen acquired by SIMS was acquired. In this way, the hydrogen content can be calculated from the secondary ion intensity of hydrogen of the outer peripheral surface of an actual piston ring measured by SIMS. As the value of the secondary ion intensity acquired by SIMS, a mean value of the secondary ion intensity of hydrogen observed in a 50 nm square region having at least 20 nm depth from the coating surface was employed. The hydrogen content of the DLC coating thus calculated is listed in Table 1. Note that with regard to "3 atomic % or less" as specified in Table 1, the actual analytical values were 1 atomic % or less but "3 atomic %" is specified to account for measurement errors.

Figure 3:
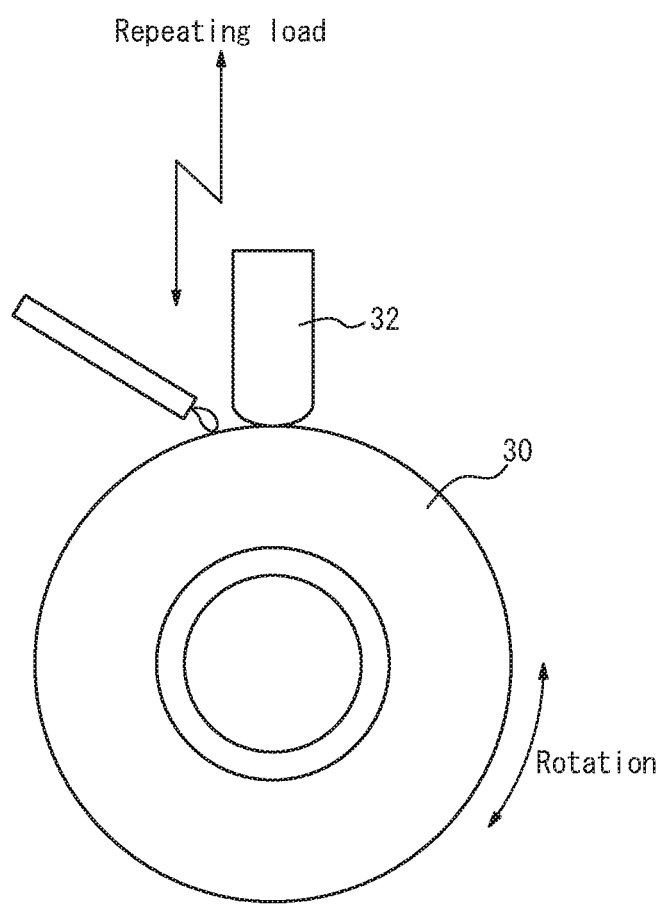
FIG. 3 is a schematic view of a test machine used for a sliding fatigue test.

In each of the examples and the comparative examples, wear resistance and peeling resistance were evaluated using the method described below. Specifically, a sliding fatigue test was conducted as an evaluation that can rapidly reproduce the peeling and wearing in a prototype test. FIG. 3 schematically illustrates the used test machine. In the sliding fatigue test, by repeatedly applying a load to each of a test piece 32 sliding on a rotating drum 30 and the drum 30, peeling resistance and wear resistance of a coating can be evaluated in a relatively short period of time. Here, the test piece 32 was obtained by cutting each of the piston rings of Examples and Comparative Examples in such a manner that a portion of an outer peripheral surface of each of the piston rings serves as a sliding surface to be subjected to the sliding fatigue test. Wear resistance was evaluated by measuring a wear depth of the sliding surface of the test piece 32 before and after the test. Further, peeling resistance was evaluated by observing the presence or absence of peeling of the sliding surface of the test piece 32 using an optical microscope. The evaluation results are listed in Table 1. The test conditions were as follows:

Load: 20 to 196 N, sine curve 50 Hz
Counterpart member (drum): 80 mm diameter SUJ2 material
Sliding speed: forward-reverse pattern operation (±7 m/s), held for 20 seconds at speed of ±7 m/s
Acceleration: 0.23 m/s$^2$
Lubricant: additive-free motor oil, 0.1 cc/min
Temperature: drum surface temperature of 80° C.
Test period: 1 hour

TABLE 1

|  | Example 1 | Example 2 | Example 3 | Example 4 | Example 5 | Example 6 | Example 7 |
|---|---|---|---|---|---|---|---|
| Hydrogen Content (Atomic %) | 3 or less | 3 or less | 3 or less | 3 or less | 3 or less | 3 or less | 3 or less |
| Thickness (μm) | 25 | 18 | 8 | 29 | 8 | 5 | 3 |
| Surface Roughness (μm) | 0.12 | 0.12 | 0.08 | 0.09 | 0.06 | 0.09 | 0.06 |
| HIT (GPa) | 35.9 | 16.9 | 24.1 | 15.5 | 44.9 | 48.5 | 36.5 |
| HM (GPa) | 14.7 | 8.5 | 10.8 | 7.2 | 19.7 | 19.9 | 14.6 |
| HM/HIT | 0.41 | 0.50 | 0.45 | 0.46 | 0.44 | 0.41 | 0.41 |
| Wear Depth (μm) | 2.7 | 4.2 | 2.8 | 3.9 | 4.1 | 3.9 | 2.8 |
| Peeling Resistance | No peeling | No peeling | No peeling | No peeling | No peeling | No peeling | No peeling |

|  | Example 8 | Comparative Example 1 | Comparative Example 2 | Comparative Example 3 | Comparative Example 4 | Comparative Example 5 |
|---|---|---|---|---|---|---|
| Hydrogen Content (Atomic %) | 3 or less | 3 or less | 3 or less | 3 or less | 25-30 | 3 or less |
| Thickness (μm) | 12 | 17 | 21 | 8 | 6 | 1.1 |
| Surface Roughness (μm) | 0.08 | 0.12 | 0.09 | 0.07 | 0.07 | 0.04 |
| HIT (GPa) | 28.8 | 38.1 | 45.6 | 52.3 | 17.6 | 57 |
| HM (GPa) | 15.8 | 12.6 | 16.7 | 19.6 | 8.8 | 23.6 |

TABLE 1-continued

| | | | | | | |
|---|---|---|---|---|---|---|
| HM/HIT | 0.55 | 0.33 | 0.37 | 0.37 | 0.50 | 0.41 |
| Wear Depth (μm) | 3.8 | 9.6 | 8.8 | 9.1 | 10.1 | 9.5 |
| Peeling Resistance | No peeling | Slight peeling | Slight peeling | Slight peeling | No peeling | Slight peeling |

Comparative Example 4 in which the hydrogen content of the DLC coating does not satisfy the range of the present disclosure and Comparative Example 5 in which the coating thickness does not satisfy the range of the present disclosure demonstrated deep wear depths and poor wear resistance. In particular, the DLC coatings and the intermediate layers of these comparative examples were worn, and portions of the base members were also worn. Although each of Comparative Examples 1 to 3 satisfied the ranges of the hydrogen content and the thickness of the DLC coating of the present disclosure, the ratio HM/HIT was less than 0.40. Thus, the wear depths were deeper than those of Examples 1 to 8, and the wear resistances were poor as compared to those of Examples 1 to 8. In Comparative Examples 1 to 3 and 5, the sliding portions were slightly peeled. Further, by comparing Example 2 and Comparative Example 1 having similar hydrogen contents and thicknesses of the DCL coatings, Example 2 in which the ratio HM/HIT is 0.40 or more significantly reduced the wear depth than Comparative Example 1 in which the ratio HM/HIT is less than 0.40, and peeling did not occur. Similarly, by comparing Example 3 and Comparative Example 3 having similar hydrogen contents and thicknesses of the DCL coatings, Example 3 in which the ratio HM/HIT is 0.40 or more significantly reduced the wear depth, and peeling did not occur, whereas in Comparative Example 3 in which the ratio HM/HIT is less than 0.40, the DLC coating was worn, a portion of the base member was exposed, and the remaining coating was slightly peeled.

INDUSTRIAL APPLICABILITY

According to the present disclosure, a sliding member having a hard carbon coating with a thickness of 3 μm or more that combines high peeling resistance and high wear resistance can be obtained. Further, according to the present disclosure, a piston ring formed by the sliding member can be obtained.

REFERENCE SIGNS LIST

100 sliding member
10 base member
12 hard carbon coating (DLC coating)
12A sliding surface
200 piston ring
20 outer circumferential surface
22 inner circumferential surface
24A, 24B top and bottom surfaces
30 drum
32 test piece

The invention claimed is:

1. A sliding member including a base member and a hard carbon coating that is formed on the base member and has a hydrogen content of 3 atomic % or less and a thickness of 3 μm or more;
    wherein, where HM represents a Martens hardness of the hard carbon coating and HIT represents an indentation hardness of the hard carbon coating, the ratio HM/HIT is 0.40 or more, the HIT is 15 GPa or more, and the HM is 6 GPa or more,
    wherein the HM and the HIT are measured according to nano-indentation hardness testing methods specified in International Standard IS014577-1:2015, and
    wherein the hard carbon coating is formed by an ion plating process with a bias voltage of −50 V or more to 0 V or less and an arc discharge current of 50 A or more to 200 A or less, and the process is intermittently paused to suppress a temperature rise of the base member.

2. The sliding member of claim 1, wherein the HIT is 50 GPa or less.

3. The sliding member of claim 1, wherein the thickness of the hard carbon coating is 5 μm or more.

4. The sliding member of claim 1, wherein a surface roughness Ra of the hard carbon coating is 0.12μm or less.

5. The sliding member of claim 1, further comprising an intermediate layer between the base member and the hard carbon coating, the intermediate layer comprising one or more materials selected from among Cr, Ti, Co, V, Mo, and W, and carbides, nitrides, and carbonitrides thereof.

6. A piston ring comprising the sliding member of claim 1.

7. The sliding member of claim 1, wherein the thickness of the hard carbon coating is 12 μm or more.

8. The sliding member of claim 1, wherein the hard carbon coating is a diamond-like carbon coating.

9. The sliding member of claim 1, wherein the base member is iron-based.

* * * * *